United States Patent
Caffee et al.

(10) Patent No.: US 9,379,879 B1
(45) Date of Patent: Jun. 28, 2016

(54) NOISE-SHAPING TIME-TO-DIGITAL CONVERTER

(71) Applicant: Silicon Laboratories Inc., Austin, TX (US)

(72) Inventors: Aaron J. Caffee, Scappoose, OR (US); Brian G. Drost, Corvallis, OR (US); James F. Parker, Beaverton, OR (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/817,129

(22) Filed: Aug. 3, 2015

(51) Int. Cl.
*H03L 7/099* (2006.01)
*H04L 7/00* (2006.01)
*H04L 7/027* (2006.01)
*G04F 10/00* (2006.01)

(52) U.S. Cl.
CPC ............ *H04L 7/0016* (2013.01); *H04L 7/0276* (2013.01); *G04F 10/005* (2013.01)

(58) Field of Classification Search
CPC .......... H03L 7/193; H03L 7/08; G04F 10/005
See application file for complete search history.

(56) References Cited

U.S. PATENT DOCUMENTS

| 8,773,182 B1 * | 7/2014 | Degani | H03L 7/085 327/147 |
| 2007/0096836 A1 * | 5/2007 | Lee | G04F 10/005 331/57 |
| 2008/0068236 A1 * | 3/2008 | Sheba | G04F 10/005 341/118 |
| 2013/0033293 A1 * | 2/2013 | Zhang | H03L 7/1976 327/156 |
| 2014/0266822 A1 * | 9/2014 | Henzler | G04F 10/005 341/118 |

OTHER PUBLICATIONS

Beards, R.D. and Copeland, M.A., "An Oversampling Delta-Sigma Frequency Discriminator," IEEE Transactions on Circuits and Systems—II: Analog and Digital Signal Processing, vol. 41, No. 1, Jan. 1994, pp. 26-32.
Galton, I. and Zimmerman, G., "Combined RF Phase Extraction and Digitization," IEEE Symposium on Circuits and Systems, 1993, pp. 1104-1107.
Talegaonkar, M., et al., "A 4.4-5.4GHz Digital Fractional-N PLL Using ΔΣ Frequency-to-Digital Converter," IEEE Symposium on VLSI Circuits Digest of Technical Papers, 2014, 2 pages.
Venerus, C. and Galton, I, "Delta-Sigma FDC Based Fractional-N PLLs," IEEE Transactions on Circuits and Systems—I: Regular Papers, 2012, pp. 1-12.

(Continued)

*Primary Examiner* — Aristocratis Fotakis
(74) *Attorney, Agent, or Firm* — Abel Law Group, LLP

(57) ABSTRACT

A noise-shaping time-to-digital converter has a large range and high resolution. The time-to-digital converter includes a phase detector configured to generate a phase error signal based on a phase-adjusted feedback signal and an input signal. The time-to-digital converter includes a loop filter configured to integrate the phase error signal and generate an analog integrated phase error signal. The time-to-digital converter includes an analog-to-digital converter configured to convert the analog integrated phase error signal to a digital phase error code. The time-to-digital converter includes a digital-to-time converter configured to convert at least a portion of the digital phase error code to a gating signal based on a reference signal and an enable signal. The time-to-digital converter includes a feedback circuit to generate the phase-adjusted feedback signal based on the reference signal and the gating signal.

17 Claims, 4 Drawing Sheets

(56) References Cited

OTHER PUBLICATIONS

Wikipedia, "Time-to-digital converter," downloaded from http://en.wikipedia.org/wiki/Time-to-digital_converter on May 8, 2015, 12 pages.

Young, B. et al., "A 2.4ps Resolution 2.1mW Second-Order Noise-Shaped Time-to-Digital Converter with 3.2ns Range in 1MHz Bandwidth," IEEE Custom Integrated Circuits Conference, 2010, pp. 1-4.

* cited by examiner

NOISE-SHAPING TIME-TO-DIGITAL CONVERTER

BACKGROUND

1. Field of the Invention

The present invention is related to data converters and more particularly to analog-to-digital converters.

2. Description of the Related Art

In general, a time-to-digital converter is an analog-to-digital data converter that generates a digital code indicative of an input time interval, typically based on a high frequency reference clock signal. Time-to-digital converters are used to measure events in various applications including clocking applications (e.g., digital phase-locked loops) and sensor applications (e.g., time-of-flight measurements). Conventional time-to-digital converters support a relatively narrow interval range in order to improve the time resolution of the converter or sacrifice time resolution for a wider interval range. Accordingly, improved techniques for time-to-digital conversion are desired.

SUMMARY OF EMBODIMENTS OF THE INVENTION

Noise-shaping time-to-digital conversion techniques are described. In at least one embodiment of the invention, an apparatus includes a time-to-digital converter. The time-to-digital converter includes a phase detector configured to generate a phase error signal based on a phase-adjusted feedback signal and an input signal. The time-to-digital converter includes a loop filter configured to integrate the phase error signal and generate an analog integrated phase error signal. The time-to-digital converter includes an analog-to-digital converter configured to convert the analog integrated phase error signal to a digital phase error code. The time-to-digital converter includes a digital-to-time converter configured to convert at least a portion of the digital phase error code to a gating signal based on a reference signal and an enable signal. The time-to-digital converter includes a feedback circuit configured to generate the phase-adjusted feedback signal based on the reference signal and the gating signal. The digital-to-time converter may selectively provide as the gating signal, a version of the enable signal selected from a plurality of versions of the enable signal according to the digital phase error code. The feedback circuit may gate the reference clock signal with the gating signal to generate the phase-adjusted feedback signal. The digital-to-time converter may convert a most-significant portion of the digital phase error code to the gating signal. The feedback circuit may include a second digital-to-time converter configured to convert a least significant portion of the digital phase error code to the phase-adjusted feedback signal based on the gating signal. The gating signal may be the phase-adjusted feedback signal.

In at least one embodiment of the invention, a method includes converting an input signal to a digital phase error code. The converting includes generating a phase error signal based on a phase-adjusted feedback signal and the input signal. The converting includes integrating the phase error signal to generate an analog integrated phase error signal. The converting includes converting the analog integrated phase error signal to the digital phase error code. The converting includes converting at least a portion of the digital phase error code to a gating signal based on a reference signal and an enable signal. The converting includes generating the phase-adjusted feedback signal based on the reference signal and the gating signal. Converting at least a portion of the digital phase error code to the gating signal may include selecting a version of the enable signal from a plurality of versions of the enable signal according to the digital phase error code. The generating the phase-adjusted feedback signal may include gating the reference clock signal with the gating signal to generate the phase-adjusted feedback signal. The most-significant portion of the digital phase error code may be the only portion of the digital phase error code converted to the gating signal. Generating the phase-adjusted feedback signal may include converting a least significant portion of the digital phase error code to the phase-adjusted feedback signal based on the gating signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
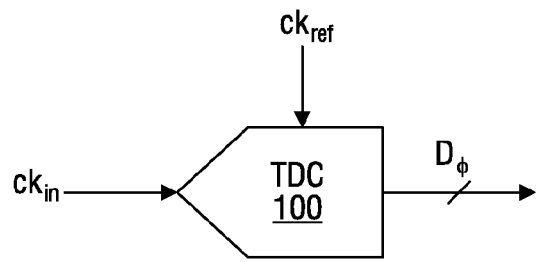
FIG. 1 illustrates a functional block diagram of a conventional time-to-digital converter.

Referring to FIG. 1, time-to-digital converter 100 generates a quantized estimate of instantaneous phase of input clock signal $ck_{in}$ with respect to an edge of reference clock signal $ck_{ref}$, and provides that quantized estimate as digital code $D_\phi$. The quantization noise and spurious tones in digital code $D_\phi$ impacts system performance, which may be unacceptable in exemplary applications (e.g., delta-sigma modulator based fractional-N phase-locked loops).

Figure 2:
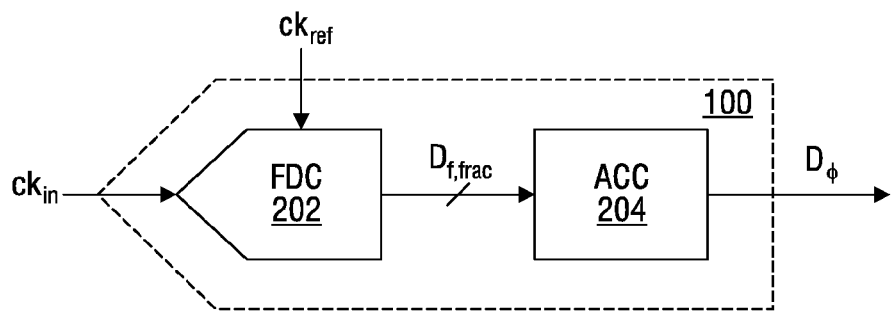
FIG. 2 illustrates a functional block diagram of a conventional time-to-digital converter based on a noise-shaping frequency-to-digital converter.

Referring to FIG. 2, an exemplary implementation of time-to-digital converter 100 includes first-order noise-shaping frequency-to-digital converter 202. Frequency-to-digital converter 202 generates a quantized estimate of the frequency ratio between the frequency of input clock signal $ck_{in}$ and a frequency of reference clock signal $ck_{ref}$ and provides that quantized estimate of frequency ratio as digital code $D_{f,frac}$. Accumulator 204 converts that frequency ratio into a phase ratio. As a result of the conversion, accumulator 204 eliminates the noise-shaping of the quantization noise in the quantized estimate of phase ratio of digital code $D_\phi$.

Figure 3:
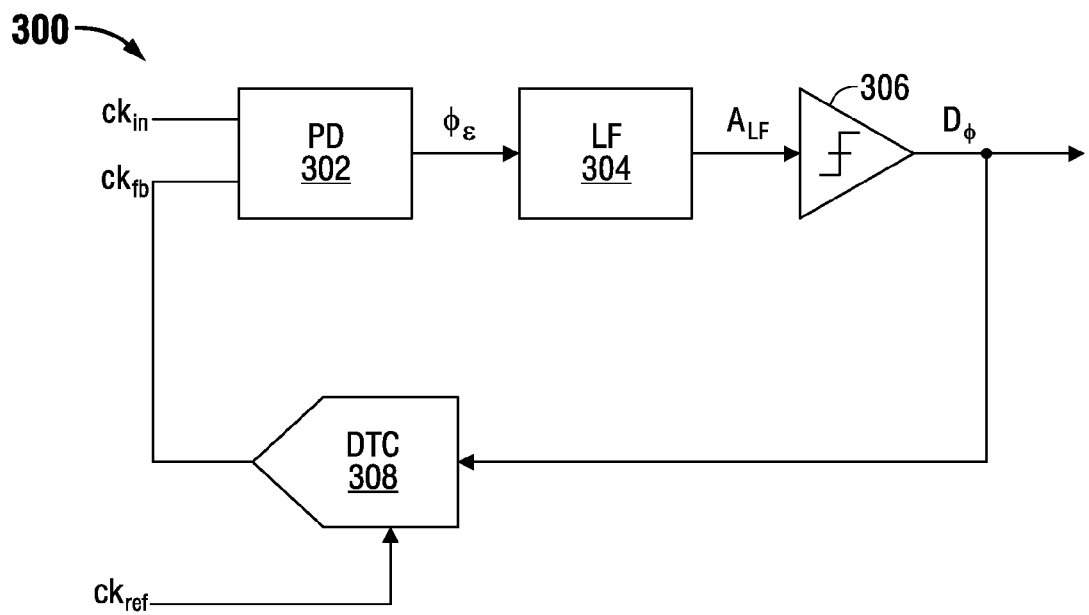
FIG. 3 illustrates a functional block diagram of a noise-shaping time-to-digital converter based on a digital-to-time converter.

Referring to FIG. 3, noise-shaping time-to-digital converter 300 performs phase error integration prior to quantization to provide second-order noise shaping in the frequency domain and first-order noise shaping in the phase domain. However, conventional digital-to-time converter 308 generates feedback clock signal $ck_{fb}$ using a phase selection technique that reduces gain accuracy due to manufacturing variations.

Figure 4:
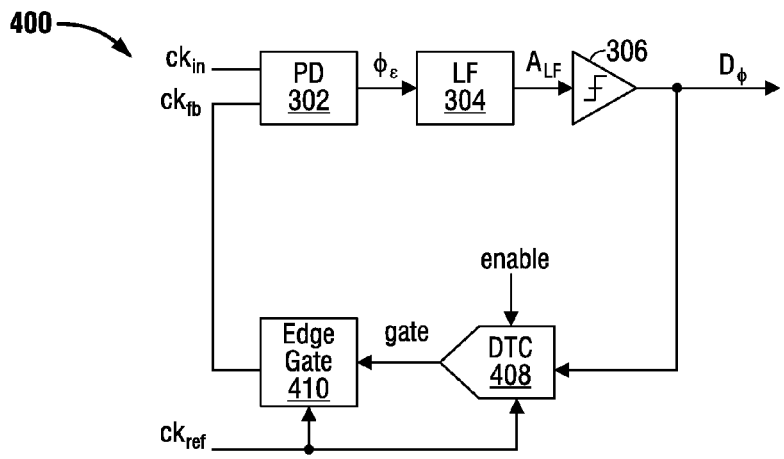
FIG. 4 illustrates a functional block diagram of a noise-shaping time-to-digital converter with phase selection consistent with at least one embodiment of the invention.
Figure 5:
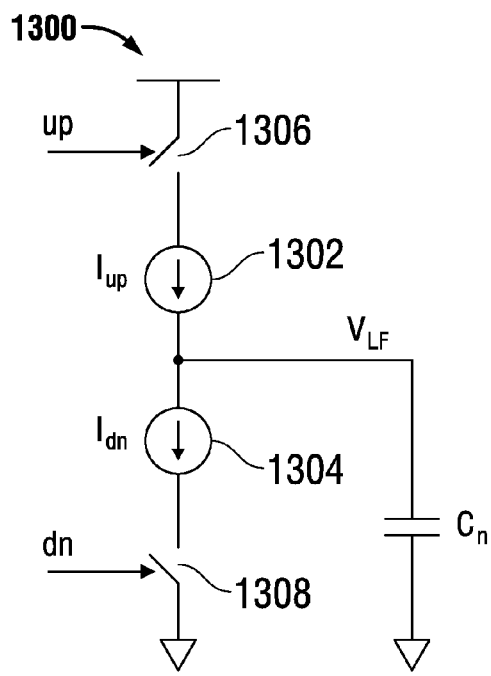
FIG. 5 illustrates a functional block diagram of an exemplary loop filter of the time-to-digital converter of FIG. 4 consistent with at least one embodiment of the invention.

Referring to FIG. 4, noise-shaping time-to-digital converter 400 performs phase error integration prior to quantization to provide second-order noise shaping in the frequency domain and first-order noise shaping in the phase domain. Noise-shaping time-to-digital converter 400 include phase detector 302 which generates a phase error signal $\phi_\epsilon$ based on the phase difference between input clock signal $ck_{in}$ and feedback clock signal $ck_{fb}$. Phase detector 302 may be any circuit configured to generate digital pulses having pulse widths modulated by the phase difference between two input signals (e.g., AND gate, SR latch, classic phase-frequency detector). Loop filter 304 integrates phase error signal $\phi_\epsilon$ to generate an analog output signal $A_{LF}$. In at least one embodiment, phase detector 302 encodes up/down pulse widths that are used to control switches 1306 and 1308 to selectively enable current sources 1302 and 1304 of loop filter 1300 of FIG. 5. Loop filter 1300 is configured as a time-to-voltage accumulator that integrates charge on feedback capacitor $C_n$ to generate voltage $V_{LF}$. Referring back to FIG. 4, in other embodiments, loop filter 304 includes a transconductor circuit and is configured as a time-to-current accumulator and/or includes switched resistors coupled to the virtual ground node. In at least one embodiment, loop filter 304 includes a time-to-voltage sample-and-hold circuit having a sample node that is sampled, e.g., by a switched-capacitor integrator and that resets the node after each sample. Analog-to-digital converter 306 quantizes analog output signal $A_{LF}$ to generate digital code $D_\phi$. Analog-to-digital converter 306 may include voltage comparators, current comparators, common analog-to-digital converter circuits, voltage-controlled oscillator-based quantizers or current-controlled oscillator-based quantizers (which also provide the integrator functionality) or other suitable circuits.

Still referring to FIG. 4, digital-to-time converter 408 and edge gating circuit 410 generate feedback clock signal $ck_{fb}$ using a phase-selection technique that precisely converts the least-significant bit of digital code $D_\phi$ to reference clock signal period $T_{ref}$. Control signal enable indicates a start and a stop of an evaluation interval. Control signal enable is a periodic signal which may have the periodicity of input clock signal $ck_{in}$ and an edge synchronous to an edge of reference clock signal $ck_{ref}$. Control signal enable triggers digital-to-time converter to start evaluating a time interval and is provided based on the application, as described further below. When control signal enable is active, digital-to-time converter 408 counts the number of clock edges indicated by digital code $D_\phi$ before asserting gating signal gate. After asserting gating signal gate, reference clock signal $ck_{ref}$ travels through a predetermined delay path, which is the same delay path for all values of digital code $D_\phi$, thereby reducing or eliminating any dependence of the gain and linearity of digital-to-time converter 400 on manufacturing variations and the value of digital code $D_\phi$. In other embodiments, time-to-digital converter 400 may realize higher orders of phase-domain noise-shaping.

Figure 6:
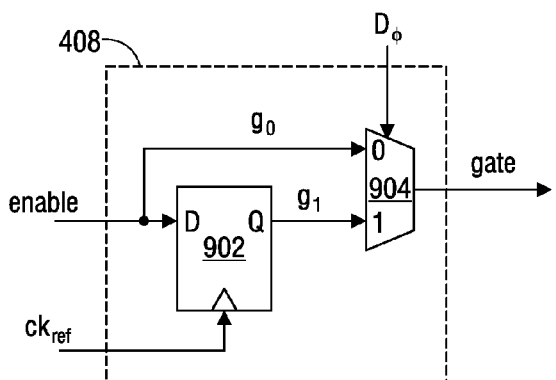
FIG. 6 illustrates a functional block diagram of an exemplary digital-to-time converter of FIG. 4 consistent with at least one embodiment of the invention.
Figure 7:
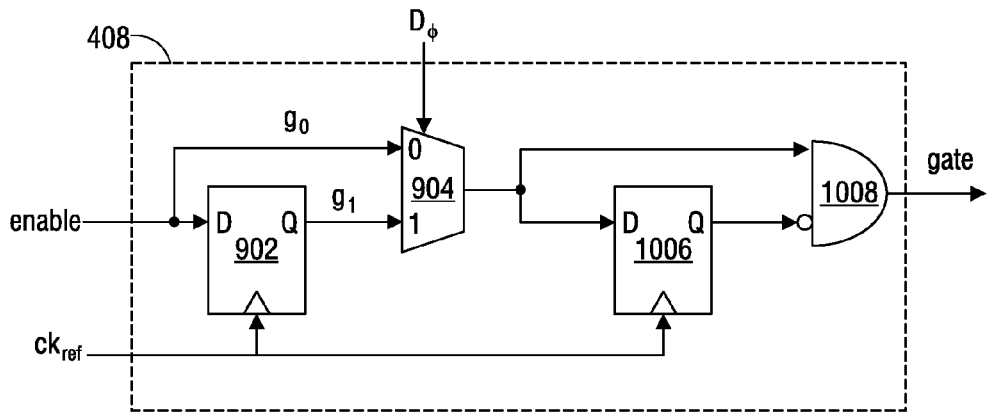
FIG. 7 illustrates a functional block diagram of an exemplary digital-to-time converter of FIG. 4 consistent with at least one embodiment of the invention.

Referring to FIGS. 4 and 6, in at least one embodiment, digital-to-time converter 408 implements a coarse conversion using a single bit to generate gating signal gate as an assertion signal. The difference in delay between two versions of control signal enable, e.g., the difference in delay between enable signal $g_0$ and delayed enable signal $g_1$, is approximately reference clock signal period $T_{ref}$. To update feedback signal $ck_{fb}$, digital code $D_\phi$ selects between enable signal $g_0$ and delayed enable signal $g_1$ based on whether input clock signal $ck_{in}$ is early or late as compared to feedback clock signal $ck_{fb}$. Referring to FIGS. 4 and 7, rather than generate gating signal gate as a gate assertion signal, digital-to-time converter 408 also includes state element 1006 and logic device 1008 to generate a pulse for gating signal gate to be a window signal. In other embodiments, digital-to-time converter 408 of FIG. 6 and digital-to-time converter 408 of FIG. 7 each include additional state elements coupled in series with state element 902 to generate delayed enable signal $g_1$ having a greater delay with respect to enable signal $g_0$ where the least-significant bit is associated with a larger time step. In addition, select circuit 904 may have a greater width of multiple bits for a greater digital-to-time conversion range while maintaining the least-significant bit as corresponding to reference clock signal period $T_{ref}$.

Figure 8:
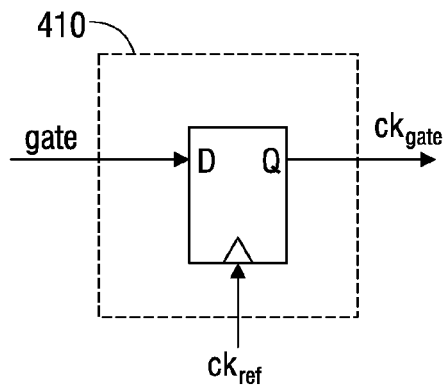
FIG. 8 illustrates a functional block diagram of an exemplary edge-gating circuit of FIG. 4 consistent with at least one embodiment of the invention.
Figure 9:
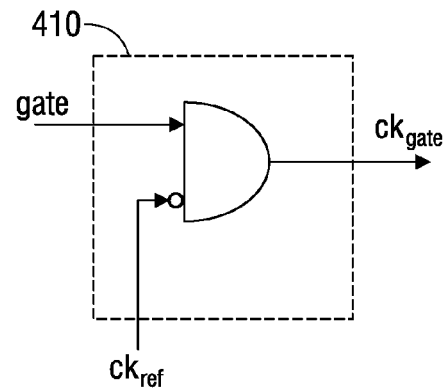
FIG. 9 illustrates a functional block diagram of an exemplary edge-gating circuit of FIG. 4 consistent with at least one embodiment of the invention.

Referring to FIG. 8, edge-gating circuit 410 uses one or more state elements to generate a gated clock signal when gating signal gate is an assertion signal (e.g., generated by digital-to-time converter 408 of FIG. 6). Edge-gating circuit 410 of FIG. 8 asserts gated clock signal $ck_{gate}$ according to a level of gating signal gate following a rising edge of reference clock $ck_{ref}$. Referring to FIGS. 7 and 9, edge gating circuit 410 uses combinatorial logic to generate gated clock signal $ck_{gate}$ when gating signal gate is a window signal (e.g., generated by 408 of FIG. 7) by windowing a pulse of the reference clock $ck_{ref}$ to generate gated clock signal $ck_{gate}$ having a width of one pulse of reference clock $ck_{ref}$. By using digital code $D_\phi$ as a select signal in the generation of feedback signal $ck_{fb}$, rather than as feedback signal $ck_{fb}$ itself, the effect of device mismatches and data dependencies within the feedback path of time-to-digital converter 400 of FIG. 4 and associated gain inaccuracy and non-linearity of feedback signal $ck_{fb}$ are reduced or eliminated.

Figure 10:
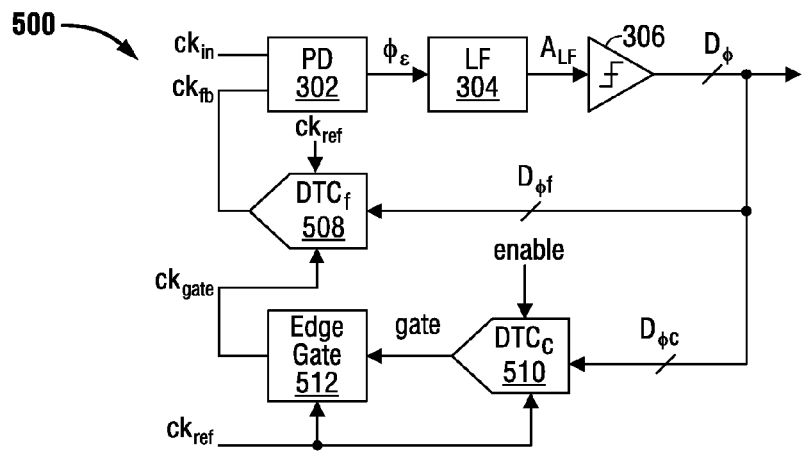
FIG. 10 illustrates a functional block diagram of a noise-shaping time-to-digital converter with fine digital-to-time conversion consistent with at least one embodiment of the invention.

In at least one embodiment, a noise-shaping time-to-digital converter further reduces quantization noise below the resolution of reference clock signal period $T_{ref}$. Referring to FIG. 10, time-to-digital converter 500 includes digital-to-time converter 508 configured as a sub-ranging or fine digital-to-time converter responsive to least-significant bits (e.g., fine bits $D_{\phi f}$) of digital code $D_\phi$. Digital-to-time converter 508 linearly delays gated clock signal $ck_{gate}$ according to fine digital code $D_{\phi f}$ and with a full-scale range of reference clock signal period $T_{ref}$. Digital-to-time converter 510 and edge-gating circuit 512 are responsive to the most-significant bits (e.g., coarse bits $D_{\phi c}$) of digital code $D_\phi$. The gain of fine digital-to-time converter 508 is derived from reference clock signal $ck_{ref}$. By providing the output of edge-gating circuit 512 to digital-to-time converter 508, rather than as the feedback signal, digital-to-time converter 508 of FIG. 5 further reduces quantization noise.

Figure 11:
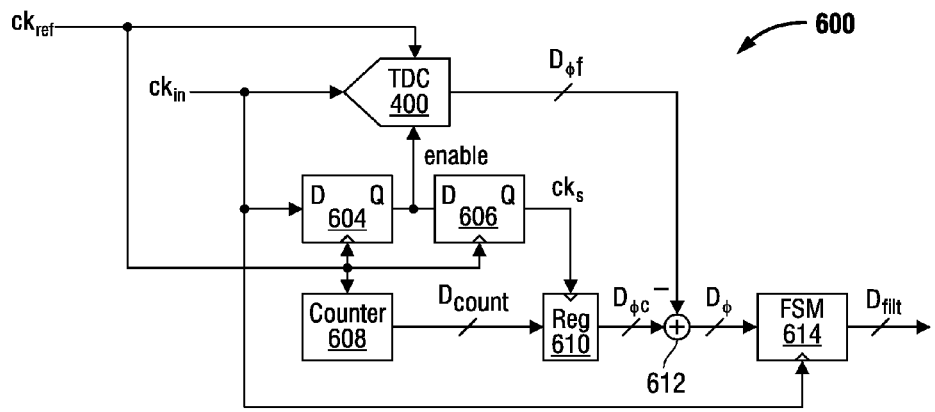
FIG. 11 illustrates a functional block diagram of a noise-shaping time-to-digital converter configured as a sub-ranging time-to-digital converter consistent with at least one embodiment of the invention.

Referring to FIG. 11, time-to-digital converter 600 includes an exemplary coarse time-to-digital converter that determines the average frequency of the input clock and information regarding instantaneous frequency (i.e. fine resolution in time). An exemplary coarse time-to-digital converter includes a free running counter having a range greater than the interval being converted (e.g., greater by at least an order of magnitude). For example, counter 608 is configured to overflow without reset and, thus, is configured as a phase accumulator achieving first order noise-shaping of the quantization noise in the frequency domain. If reference clock signal $ck_{ref}$ is asynchronous to input clock signal $ck_{in}$, then sampling the coarse time-to-digital converter output $D_{count}$ by register 610 results in quantization noise in the phase domain. That quantization noise is determined by the least significant bit of counter 608, which is defined by reference clock signal period $T_{ref}$. Accordingly, time-to-digital converter 600 includes noise-shaping time-to-digital converter 400 configured as a fine range, i.e., sub-ranging, time-to-digital converter. State element 604 synchronizes input clock signal $ck_{in}$ with reference clock signal $ck_{ref}$ and provides control signal enable to noise-shaping time-to-digital converter 400. Control signal enable indicates start and stop evaluation of input clock signal $ck_{in}$. Noise-shaping time-to-digital converter 400 resamples input clock signal $ck_{in}$ using reference clock signal $ck_{ref}$.

Noise-shaping time-to-digital converter 400 and counter 608 of time-to-digital converter 600 have common quantization noise since they sample using the same reference clock signal. Noise-shaping time-to-digital converter 400 accumulates phase residues at sample time boundaries and generates a fine digital code $D_{\phi f}$, which has the same quantization noise as the least-significant bit of coarse digital code $D_{\phi c}$. Since time-to-digital converter 400 and counter 608 have gains defined by $T_{ref}$ subtraction of fine digital code $D_{\phi f}$ from coarse digital code $D_{\phi c}$ generates digital code $D_\phi$ having residual noise-shaped quantization noise. Finite state machine 614 samples digital code $D_\phi$, which effectively digitally filters $D_\phi$ to generate a lower noise version and higher resolution (e.g., larger bus width) signal $D_{filt}$. Since clock-to-output delay of state element 604 and state element 606 of control signal enable and clock signal $ck_s$, respectively, is the same, only a fixed phase offset is present in those signals. Additional accuracy may be achieved by replacing noise-shaping time-to-digital converter 400 with noise-shaping time-to-digital converter 500 of FIG. 10 in sub-ranging noise-shaping time-to-digital converter 600 of FIG. 11. Thus, time-to-digital converter 600 combines features of a frequency counter-based time-to-digital converter (which has greater range and determines an integer frequency ratio) and fine time-to-digital converter (which has lower noise and determines a fractional frequency ratio).

Figure 12:
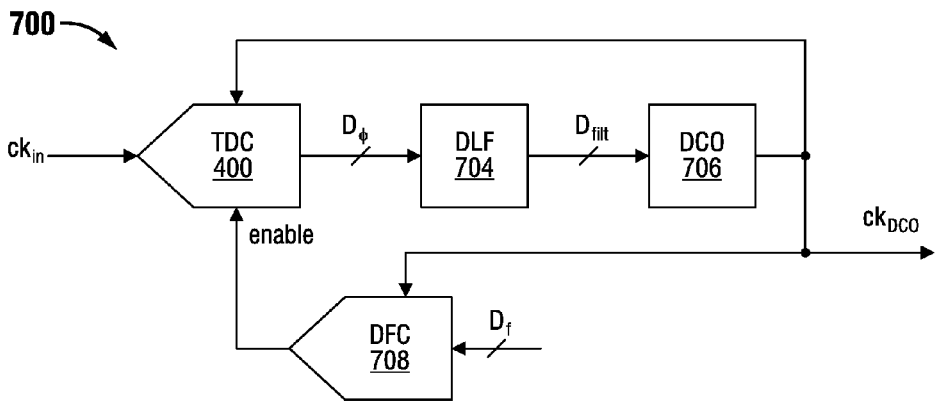
FIG. 12 illustrates a functional block diagram of noise-shaping time-to-digital converter configured as the front-end of a digital phase-locked loop consistent with at least one embodiment of the invention.

In at least one embodiment, noise-shaping time-to-digital converter 400 of FIG. 4 is configured as a replacement for the front-end of an analog phase-locked loop to form digital phase-locked loop 700 of FIG. 12. Time-to-digital converter 400 converts input clock signal $ck_{in}$ to digital code $D_\phi$ using output clock $ck_{DCO}$ as the reference clock signal. Digital code $D_\phi$ indicates the phase difference between clock signal $ck_{in}$ and output clock $ck_{DCO}$. Digital loop filter 704 integrates digital code $D_\phi$ to generate digital frequency control signal $D_{filt}$. Digitally controlled oscillator 706 generates output clock $ck_{DCO}$ according to digital frequency control signal $D_{filt}$. Digital-to-frequency converter 708 converts a predetermined digital frequency code $D_f$ to control signal enable, which is a clock signal having the predetermined frequency using output clock $ck_{DCO}$ as the analog reference signal. Additional precision may be achieved by replacing time-to-digital converter 400 with time-to-digital converter 500 of FIG. 10 in digital frequency-locked loop 700 of FIG. 12.

Figure 13:
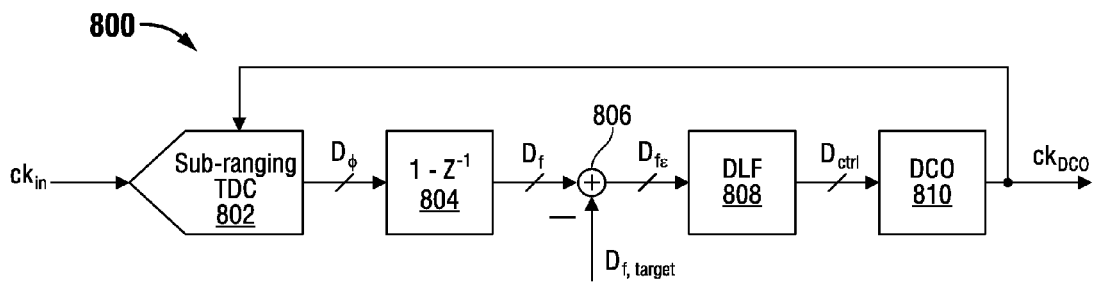
FIG. 13 illustrates a functional block diagram of a sub-ranging time-to-digital converter configured as the front-end of a digital frequency-locked loop consistent with at least one embodiment of the invention.

Referring to FIG. 13, in at least one embodiment, sub-ranging time-to-digital converter 600 of FIG. 11 is included as sub-ranging time-to-digital converter 802 as a digital equivalent of a frequency-detector/charge pump that would otherwise be included as analog-front end of frequency-locked loop 800 of FIG. 13. Sub-ranging time-to-digital converter 802, which may include filter 804, generates digital code $D_\phi$ having residual noise-shaped quantization noise. Filter 804 digitally differentiates $D_\phi$ to generate a digital frequency code $D_f$ with an additional order of noise shaping in the frequency domain. Summing node 806 generates a digital frequency error code $D_{fe}$ by combining digital frequency code $D_f$ with target frequency code $D_{f,target}$. Digital loop filter 808 low pass filters digital frequency error code $D_{fe}$ and drives a digitally controlled oscillator 810 with control code $D_{ctrl}$ to generate output clock signal $ck_{DCO}$ having a target frequency.

Thus, noise-shaping time-to-digital conversion techniques that have greater range and increased resolution as compared to other time-to-digital converters have been disclosed. While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims.

The description of the invention set forth herein is illustrative, and is not intended to limit the scope of the invention as set forth in the following claims. Variations and modifications of the embodiments disclosed herein, may be made based on the description set forth herein, without departing from the scope and spirit of the invention as set forth in the following claims.

What is claimed is:

1. An apparatus comprising:
   a time-to-digital converter comprising:
   a phase detector configured to generate a phase error signal based on a phase-adjusted feedback signal and an input signal;
   a loop filter configured to integrate the phase error signal and generate an analog integrated phase error signal; and
   an analog-to-digital converter configured to convert the analog integrated phase error signal to a digital phase error code;
   a digital-to-time converter configured to convert at least a portion of the digital phase error code to a gating signal based on a reference clock signal and an enable signal; and a feedback circuit configured to generate the phase-adjusted feedback signal based on the reference clock signal and the gating signal.

2. The apparatus, as recited in claim 1, wherein the digital-to-time converter selectively provides as the gating signal, a version of the enable signal selected from a plurality of versions of the enable signal according to the digital phase error code.

3. The apparatus, as recited in claim 2, wherein the feedback circuit gates the reference clock signal with the gating signal to generate the phase-adjusted feedback signal.

4. The apparatus, as recited in claim 1, wherein the digital-to-time converter converts a most-significant portion of the digital phase error code to the gating signal and the feedback circuit comprises:
   a second digital-to-time converter configured to convert a least significant portion of the digital phase error code to the phase-adjusted feedback signal based on the gating signal.

5. The apparatus, as recited in claim 1, wherein the time-to-digital converter is configured as an error generation circuit responsive to the enable signal received from a coarse time-to-digital converter, the digital phase error code corresponding to a quantization error of a second digital phase error code, the apparatus further comprising:
   a coarse time-to-digital converter configured to generate the second digital phase error code; and
   an output circuit configured to combine the digital phase error code and the second digital phase error code to generate a digital output signal indicative of an input time interval.

6. The apparatus, as recited in claim 1, further comprising:
   a digital loop filter configured to integrate the digital phase error code to generate a digital integrated phase error code;
   a digitally controlled oscillator configured to generate an output clock signal based on the digital integrated phase error code;
   a digital-to-frequency converter configured to generate the enable signal based on a digital frequency code and the output clock signal.

7. The apparatus, as recited in claim 1, wherein the time-to-digital converter shapes noise in the phase domain and maintains at least first-order noise shaping in the phase-adjusted feedback signal.

8. The apparatus, as recited in claim 1, wherein generation of the phase-adjusted feedback signal based on the reference clock signal has linear gain.

9. A method comprising:
   converting an input signal to a digital phase error code comprising:
      generating a phase error signal based on a phase-adjusted feedback signal and the input signal;
      integrating the phase error signal to generate an analog integrated phase error signal;
      converting the analog integrated phase error signal to the digital phase error code;
      converting at least a portion of the digital phase error code to a gating signal based on a reference clock signal and an enable signal; and
      generating the phase-adjusted feedback signal based on the reference clock signal and the gating signal.

10. The method, as recited in claim 9, wherein converting at least a portion of the digital phase error code to the gating signal comprises selecting a version of the enable signal from a plurality of versions of the enable signal according to the digital phase error code.

11. The method, as recited in claim 9, wherein generating the phase-adjusted feedback signal comprises gating the reference clock signal with the gating signal to generate the phase-adjusted feedback signal.

12. The method, as recited in claim 9, wherein only the most-significant portion of the digital phase error code is converted to the gating signal and generating the phase-adjusted feedback signal comprises:
   converting a least significant portion of the digital phase error code to the phase-adjusted feedback signal based on the gating signal.

13. The method, as recited in claim 9, further comprising:
   generating a second digital phase error code; and
   combining the digital phase error code and the second digital phase error code to generate a digital output signal indicative of an input time interval, wherein the enable signal is a delayed version of the input signal.

14. The method, as recited in claim 9, further comprising:
   integrating the digital phase error code to generate a digital integrated phase error code;
   generating an output clock signal based on the digital integrated phase error code;
   generating the enable signal based on a digital frequency code and the output clock signal.

15. The method, as recited in claim 9, wherein the converting the input signal to the digital phase error shapes noise in the phase domain and maintains at least first-order noise shaping in the phase-adjusted feedback signal.

16. The method, as recited in claim 9, wherein generation of the phase-adjusted feedback signal based on the reference clock signal has linear gain.

17. The method, as recited in claim 9, further comprising:
   integrating the digital phase error code to generate a digital integrated phase error code;
   generating a frequency error code based on the digital integrated phase error code and a target frequency code;
   integrating the frequency error code to generate a digital control code;
   generating an output clock signal based on the digital control code, the output clock signal being provided as the reference clock signal.

* * * * *